(12) United States Patent
Tee

(10) Patent No.: US 10,733,136 B1
(45) Date of Patent: Aug. 4, 2020

(54) VERTICAL SURFACE MOUNT TYPE C USB CONNECTOR

(71) Applicant: Western Digital Technologies, Inc., San Jose, CA (US)

(72) Inventor: Khoon Guan Tee, Batu Kawan (MY)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/290,116

(22) Filed: Mar. 1, 2019

(51) Int. Cl.
*G06F 13/42* (2006.01)
*H01L 23/40* (2006.01)
*H01L 23/495* (2006.01)
*H01B 7/04* (2006.01)
*H01L 21/56* (2006.01)
*H01L 23/49* (2006.01)

(52) U.S. Cl.
CPC ............ *G06F 13/4282* (2013.01); *H01B 7/04* (2013.01); *H01L 21/565* (2013.01); *H01L 23/4012* (2013.01); *H01L 23/49* (2013.01); *H01L 23/49503* (2013.01)

(58) Field of Classification Search
CPC ..... G06F 13/4282; H01B 7/04; H01L 21/565; H01L 23/4012; H01L 23/49; H01L 23/49503
USPC .......................................... 710/313; 361/760
See application file for complete search history.

(56) References Cited

U.S. PATENT DOCUMENTS

| | | | | |
|---|---|---|---|---|
| 3,946,477 A * | 3/1976 | Cobaugh | ............... | H01R 3/205 29/741 |
| 4,580,858 A * | 4/1986 | Daberkoe | ............ | H01R 12/724 439/64 |
| 4,645,287 A * | 2/1987 | Olsson | .................... | H05K 3/301 439/571 |
| 4,685,886 A * | 8/1987 | Denlinger | .............. | H01R 13/11 439/55 |
| 5,029,748 A * | 7/1991 | Lauterbach | ............ | B23K 3/087 228/180.1 |
| 5,351,393 A * | 10/1994 | Gregoire | ........... | H01L 23/49555 257/E23.048 |
| 5,386,341 A * | 1/1995 | Olson | ..................... | H01L 23/13 174/252 |
| 5,646,446 A * | 7/1997 | Nicewarner, Jr. | ... | H01L 23/5387 257/723 |
| 5,751,556 A * | 5/1998 | Butler | .................... | H01R 12/57 174/250 |
| 6,121,676 A * | 9/2000 | Solberg | ............... | H01L 23/5387 257/686 |
| 6,172,418 B1 * | 1/2001 | Iwase | .................. | H01L 23/5387 257/723 |
| 6,208,521 B1 * | 3/2001 | Nakatsuka | .......... | H01L 23/5387 174/254 |
| 6,259,039 B1 * | 7/2001 | Chroneos, Jr. | ....... | H01R 3/0256 174/260 |

(Continued)

FOREIGN PATENT DOCUMENTS

| | | |
|---|---|---|
| CN | 207124315 U | 3/2018 |
| JP | 2013004176 A | 1/2013 |
| WO | 2018116563 A1 | 6/2018 |

*Primary Examiner* — Paul R. Myers
(74) *Attorney, Agent, or Firm* — Rowan TELS LLC

(57) ABSTRACT

Semiconductor substrate sections joined by an integral flexible cable are utilized to form a device comprising a connector. The connector can be surface mounted on through-holes and soldered for enhanced robustness.

15 Claims, 8 Drawing Sheets

(56) References Cited

U.S. PATENT DOCUMENTS

| | | | |
|---|---|---|---|
| 6,683,377 B1 * | 1/2004 | Shim | H01L 23/5387 |
| | | | 257/723 |
| 7,149,095 B2 * | 12/2006 | Warner | H01L 23/5387 |
| | | | 361/803 |
| 7,479,017 B1 * | 1/2009 | Koopman | H01R 13/6658 |
| | | | 439/67 |
| 7,545,649 B2 * | 6/2009 | Tan | H05K 1/028 |
| | | | 174/254 |
| 7,586,758 B2 * | 9/2009 | Cady | H01L 23/3114 |
| | | | 174/260 |
| 8,203,847 B2 | 6/2012 | Koh | |
| 2003/0194908 A1 | 10/2003 | Brown et al. | |
| 2004/0061147 A1 * | 4/2004 | Fujita | H01L 25/18 |
| | | | 257/232 |
| 2004/0124517 A1 * | 7/2004 | Hsieh | H01L 23/42 |
| | | | 257/686 |
| 2004/0238206 A1 * | 12/2004 | Reid | H01L 23/5387 |
| | | | 174/254 |
| 2009/0042420 A1 | 2/2009 | Zheng et al. | |
| 2009/0175015 A1 * | 7/2009 | Mukouyama | H05K 1/148 |
| | | | 361/785 |
| 2012/0170231 A1 * | 7/2012 | Lee | H05K 1/145 |
| | | | 361/749 |
| 2012/0194990 A1 * | 8/2012 | Kuster | G06K 19/07707 |
| | | | 361/679.31 |
| 2014/0053402 A1 * | 2/2014 | Margrave | H01R 13/6581 |
| | | | 29/876 |
| 2017/0314922 A1 * | 11/2017 | Poulad | H05K 7/1422 |

* cited by examiner

VERTICAL SURFACE MOUNT TYPE C USB CONNECTOR

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
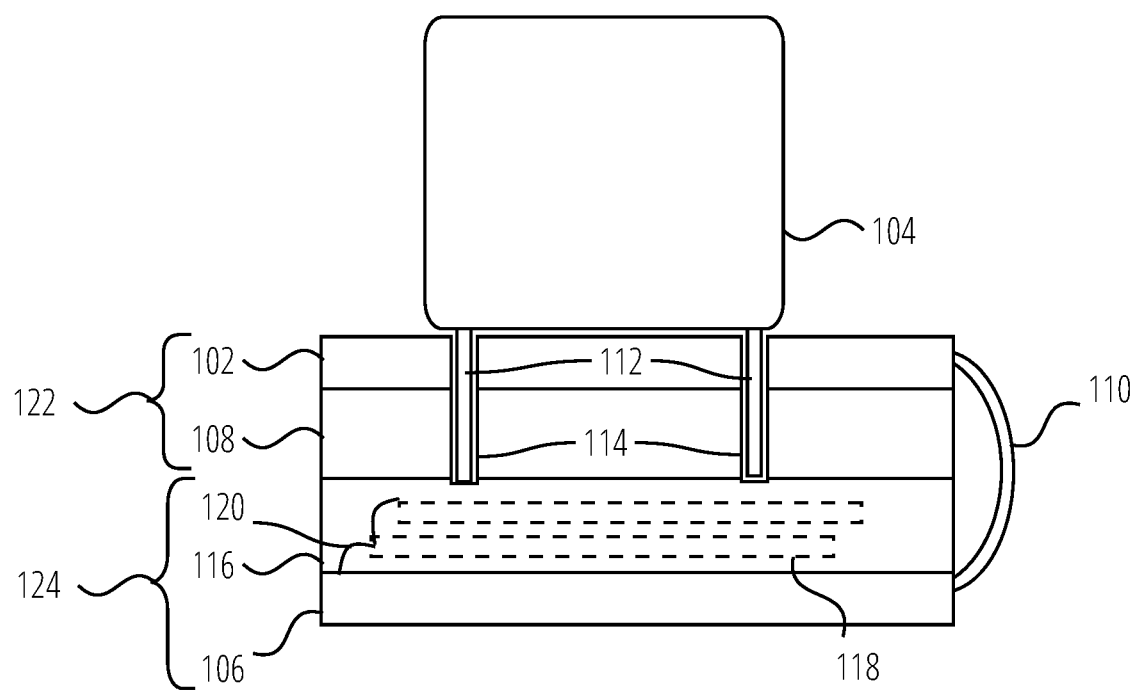
FIG. 1 illustrates an apparatus in accordance with one embodiment.

Embodiments will now be described with reference to the figures, which relate to a Universal Serial Bus ("USB") device and a system-in-a-package (SIP). It is understood that the present technology may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.25% of a given dimension.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

FIG. 1 illustrates an apparatus in one embodiment, comprising a first substrate section 102 coupled via a flexible cable 110 to a second substrate section 106. Herein reference to a 'cable' refers to any multi-conductor signal path which may include signal conductors organized into a bus, and also may include conductors that aren't part of a bus architecture or protocol. The substrate sections may be formed for example from polysilicon and may vary in thickness according to the process technology and implementation. In one embodiment, the substrate sections are 0.13 mm thick (give or take within a defined tolerance). More generally, the substrate sections can be any thickness depending on the process technology, but may typically fall in a range of thickness between 0.5 mm and 0.05 mm. The substrate sections comprising conductors for routing signals to and from the pins of the surface mounted connector 104. These signals for example may propagate over the flexible cable 110 to and from semiconductor dies.

The connector 104 may be surface mounted to the first substrate section 102 with mounting pins 112 (not to be confused with signal pins that carry signals) that extend through through-holes 114 and which are secured with solder joints at their termination point. The connector 104 can be, but is not limited to, a Type C USB connector (e.g., with 24 signal pins). For electrical safety the mounting pins 112 may also make contact with a ground plane of the first substrate section 102. The through-holes 114 may be formed in the mold cavity used to apply the mold compound, or may be drilled or etched, depending on the process implementation.

The first substrate section 102 and second substrate section 106 are separated by a first mold compound layer 108 and a second mold compound layer 116. The mold compound may be an epoxy or other protective insulating material (e.g., a plastic), as known in the art. The mounting pins 112 terminate and are soldered near the junction of the first mold compound layer 108 and second mold compound layer 116. Herein the mounting pins 112 of the connector 104 will be described as soldered in place, however, it should be understood that other methods of securing the mounting pins 112 may be utilized such as bonding with strong epoxy or by way of mechanical fasteners.

A semiconductor die stack 118 is formed and embedded into the second mold compound layer 116. The semiconductor die stack 118 may include any number (one or more) semiconductor die comprising integrated circuits and other electrical components and signal routing therebetween. If the semiconductor die stack 118 includes multiple semiconductor die, the multiple semiconductor die can be electrically connected by bonding wires 120. Bonding wires 120 may be formed from materials and in manners known in the art. For example the bonding wires 120 may be gold or copper and attached using techniques such as "DA" (Die Attachment) and "WB" (wire bonding). The second mold compound layer 116 may have any thickness, depending on factors such as the number of semiconductor die and thickness of each semiconductor die. An example thicknesses of the second mold compound layer 116 is 0.49 mm, give or take depending on the implementation tolerance. The first mold compound layer 108 may have the same thickness as the second mold compound layer 116 or a different thickness. In one embodiment, both the first mold compound layer 108 and the second mold compound layer 116 are 0.49 mm, the first substrate section 102 and the second substrate section 106 are each 0.13 mm thick, for a combined thickness of 1.24 mm.

Figure 2:
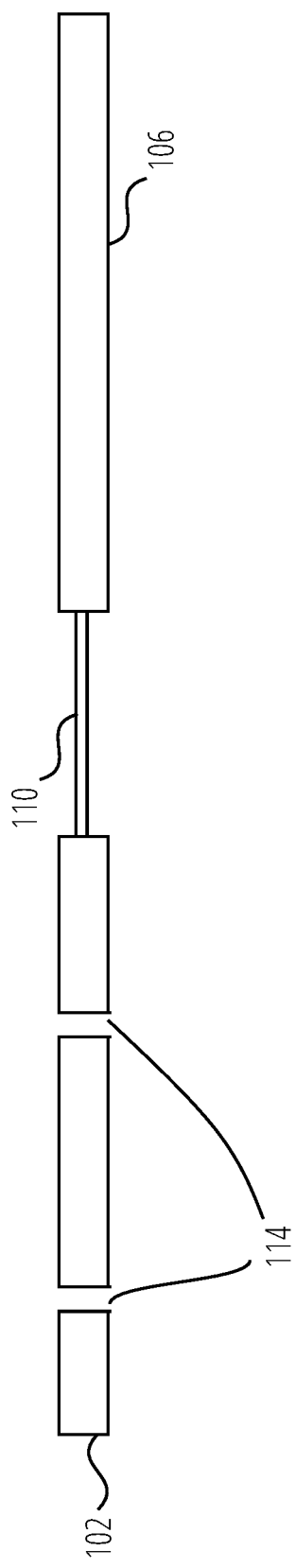
FIG. 2 illustrates an intermediate manufacturing phase in accordance with one embodiment.
Figure 3:
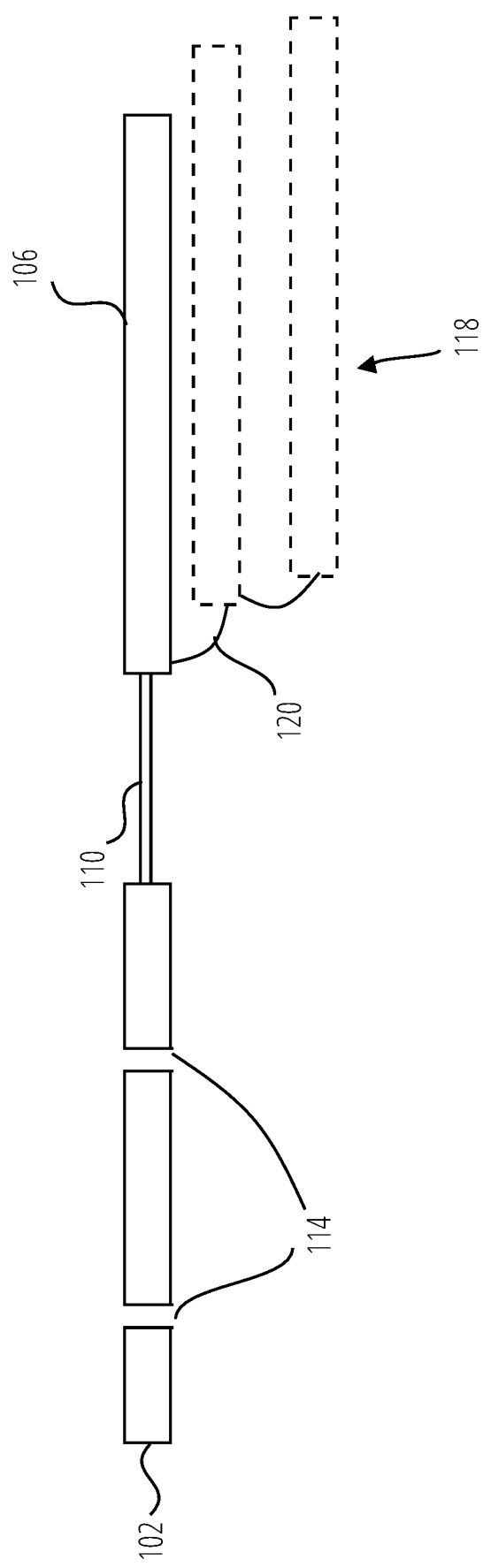
FIG. 3 illustrates a further intermediate manufacturing phase in accordance with one embodiment.
Figure 4:
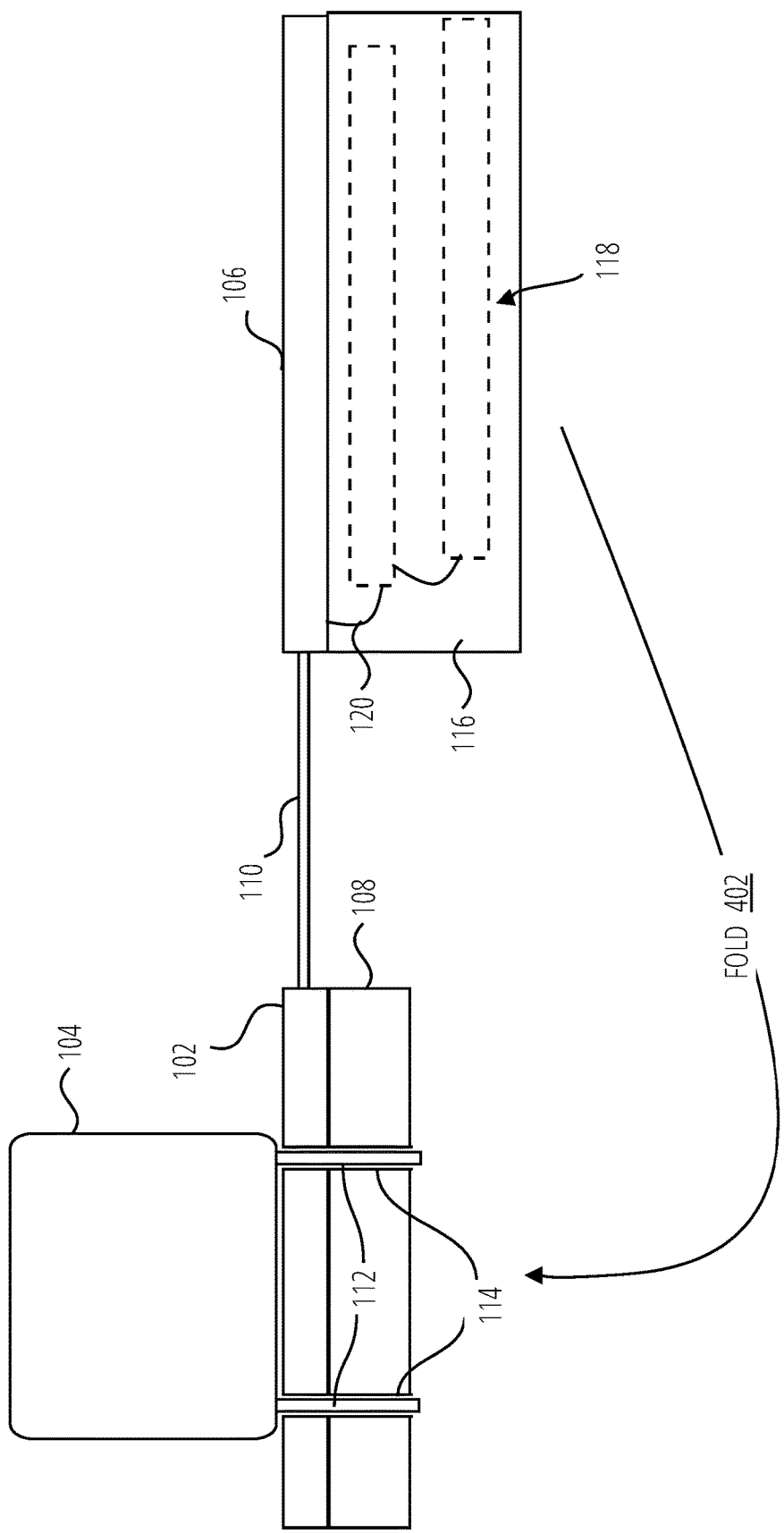
FIG. 4 illustrates a further intermediate manufacturing phase in accordance with one embodiment.

Fabrication of the apparatus depicted in FIG. 1 may be carried out, in one embodiment, as illustrated in the sequence depicted in FIG. 2-FIG. 4. FIG. 2 illustrates first substrate section 102, second substrate section 106, and an integral flexible cable 110 in one embodiment. Using conventional fabrication techniques, the first substrate section 102 is formed and through-holes 114 are drilled, etched, or otherwise created in the first substrate section 102. The second substrate section 106 is likewise formed in conventional manners. The flexible cable 110 is formed integral with the first substrate section 102 and second substrate section 106, for example by etching signal traces in a substrate, etching or cutting surrounding material, and applying an insulation layer or layers. The flexible cable 110 carries signals between the first substrate section 102 and second substrate section 106, for example signals to and from the signal pins of the connector 104 and one or more layers of the semiconductor die stack 118. In other embodiments the flexible cable 110 may be a snap-on cable that couples to electrical connection blocks on the first substrate section 102 and second substrate section 106.

FIG. 3 illustrates formation the semiconductor die stack 118 coupled via the bonding wires 120 to the second substrate section 106. The semiconductor die stack 118 layers are formed in conventional manners and electrically bonded using bonding wires 120 to one another and to the second substrate section 106. Electrical connections between multiple dies, or between the semiconductor die stack 118 and second substrate section 106 can also be achieved using flip chip technology or through-silicon via (TSV) technology. In a typical embodiment, individual semiconductor die of the semiconductor die stack are electrically bonded together and at least one of the individual semiconductor die is directly electrically bonded to the second substrate section. In this embodiment, due to the manner of fabrication, none of the individual semiconductor die are directly electrically bonded to the first substrate section 102.

FIG. 4 illustrates a first mold compound layer 108 formed under the first substrate section 102 and the through-holes 114 that extend through the first mold compound layer 108. A second mold compound layer 116 is formed under the second substrate section 106 to encase the semiconductor die stack 118. The mounting pins 112 of the connector 104 are inserted into the through-holes 114 and secured with solder joints at the points at a terminus of the mounting pins 112, for example where they protrude slightly from the first mold compound layer 108 or into a counter-set of the through-holes 114 (e.g., a shallow hole of larger diameter formed coaxial with the through-holes 114). The second substrate section 106 and second mold compound layer 116 are rotated (i.e. via the path roughly illustrated by fold 402) under the first mold compound layer 108, producing the device design illustrated in FIG. 1. Adhesive tape, glue, and/or mechanical fasteners may be applied to retain the folded section (second substrate section 106 and second mold compound layer 116) to the top section (first substrate section 102 and first mold compound layer 108).

The first substrate section 102, first mold compound layer 108, mounting pins 112 and connector 104 can be referred to as the device first portion 122. Further, the second substrate section 106 and second mold compound layer 116 can be referred to as the device second portion 124.

Figure 5:
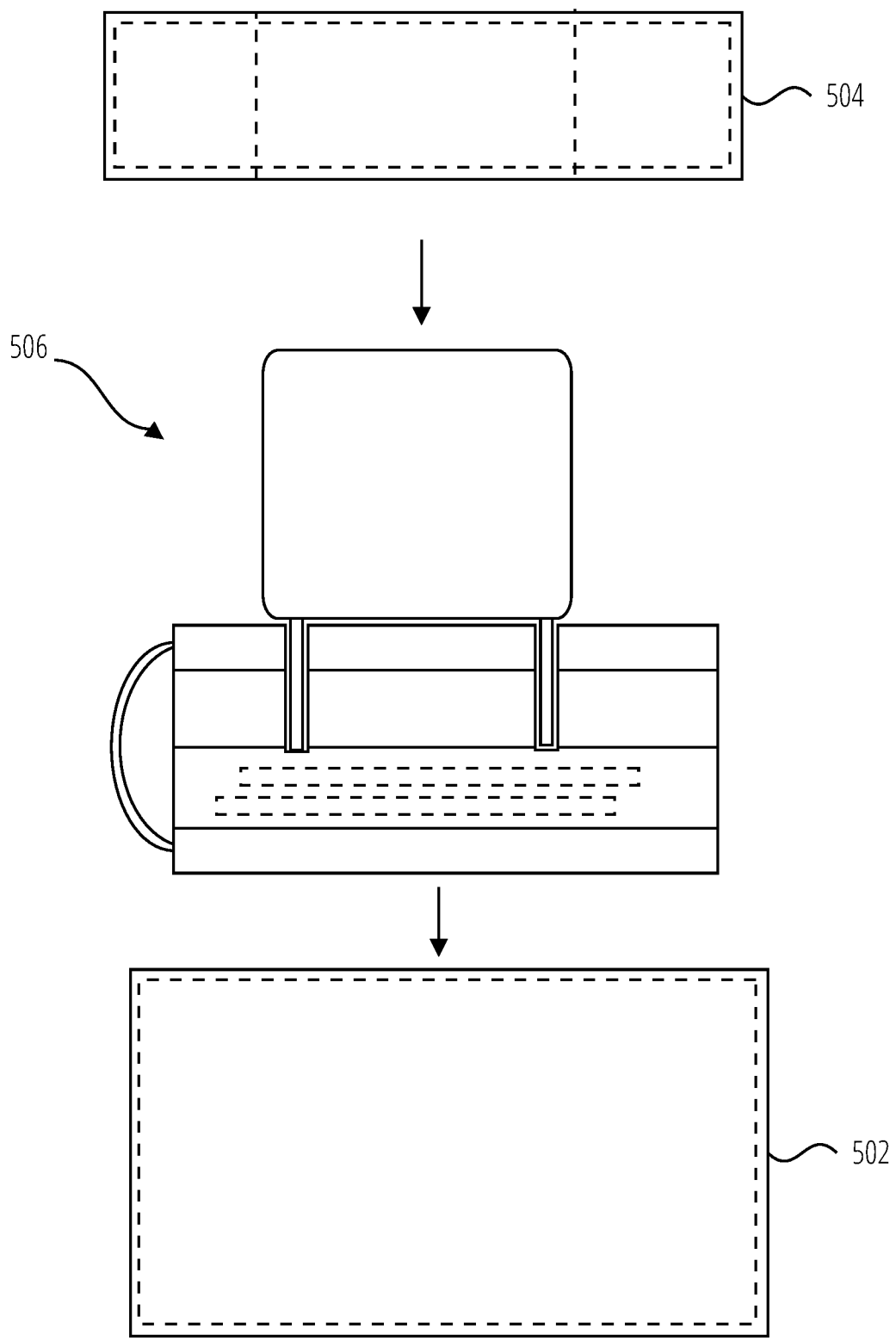
FIG. 5 illustrates an apparatus in accordance with one embodiment.

As shown in FIG. 5, an embodiment of apparatus comprises a housing 502, a connector cover 504, and the system-in-a-package with connector 506. Examples of such devices are mobile phones and portable music players. The apparatus may in one embodiment be a flash memory drive, a pluggable secure storage device (SSD, for example 'thumb drive'), or other removable memory device. "Removable" refers to a device that may be added or removed from a computer system by connecting or disconnecting a connector such as a Type C USB connector.

Figure 6:
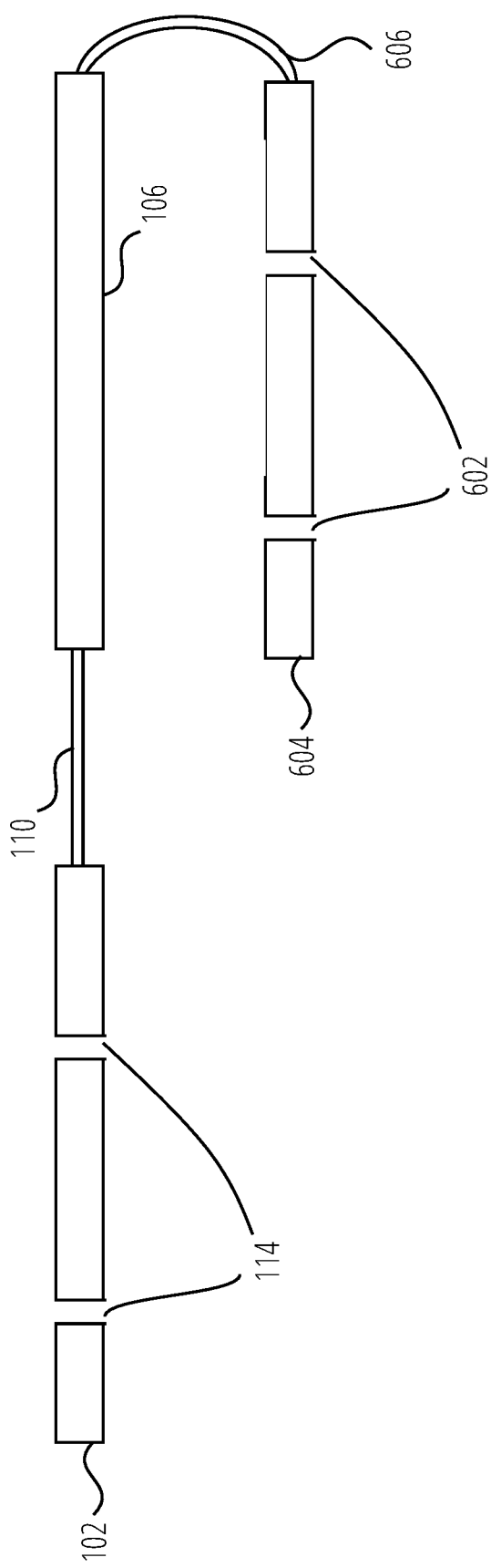
FIG. 6 illustrates an alternate embodiment of an intermediate manufacturing phase.

An alternate embodiment is illustrated in FIG. 6. This embodiment can include the first substrate section 102 with through-holes 114, second substrate section 106, and flexible cable 110 as before, but further includes a third substrate section 604 with second through-holes 602 and a second flexible cable 606. The alternate embodiment may be manufactured into either the apparatus shown in FIG. 7, or the apparatus shown in FIG. 8.

Figure 7:
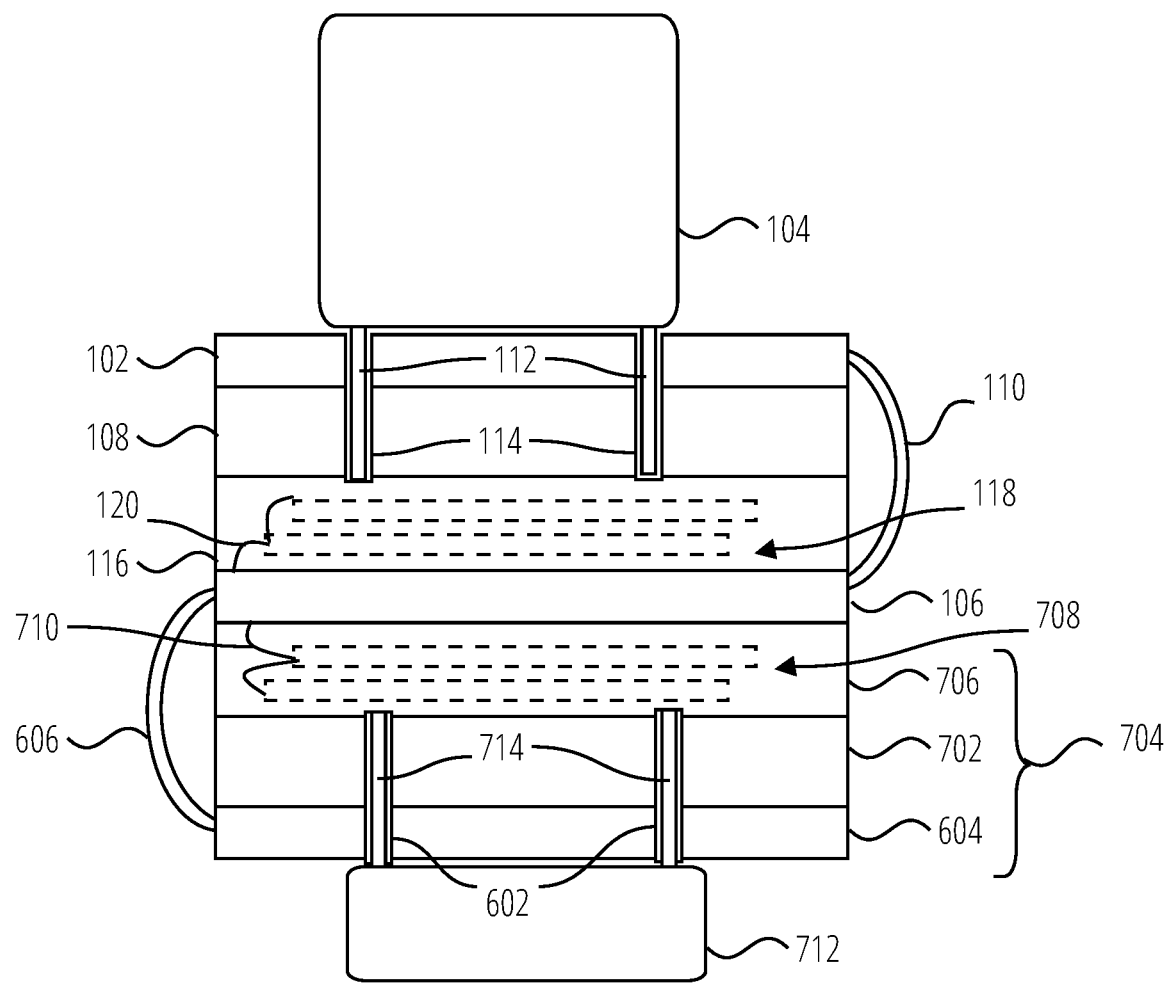
FIG. 7 illustrates an alternative apparatus in accordance with one embodiment.

The apparatus of FIG. 7 has features in common with the apparatus of FIG. 1, and these features formed in the same manner described in conjunction with FIG. 1. However the apparatus in FIG. 17 further includes a third mold compound layer 702 and fourth mold compound layer 706 formed under the third substrate section 604. The fourth mold compound layer 706 comprising a second semiconductor die stack 708 joined with second bonding wires 710. After forming the third mold compound layer 702 and fourth mold compound layer 706, the second connector mounting pins 714 of a second connector 712 are inserted through the second through-holes 602 of the third substrate section 604 and third mold compound layer 702 and secured in place with solder joints. The fourth mold compound layer 706 is then rotated (folded) under the second substrate section 106 by bending the second flexible cable 606.

The third substrate section 604, third mold compound layer 702, and fourth mold compound layer 706 can be referred to the device third portion 704.

In this manner, connectors may be mounted on two sides of the apparatus. Adhesive tape, glue, and/or mechanical fasteners may be applied to retain the folded sections to the sections they are folded under.

Figure 8:
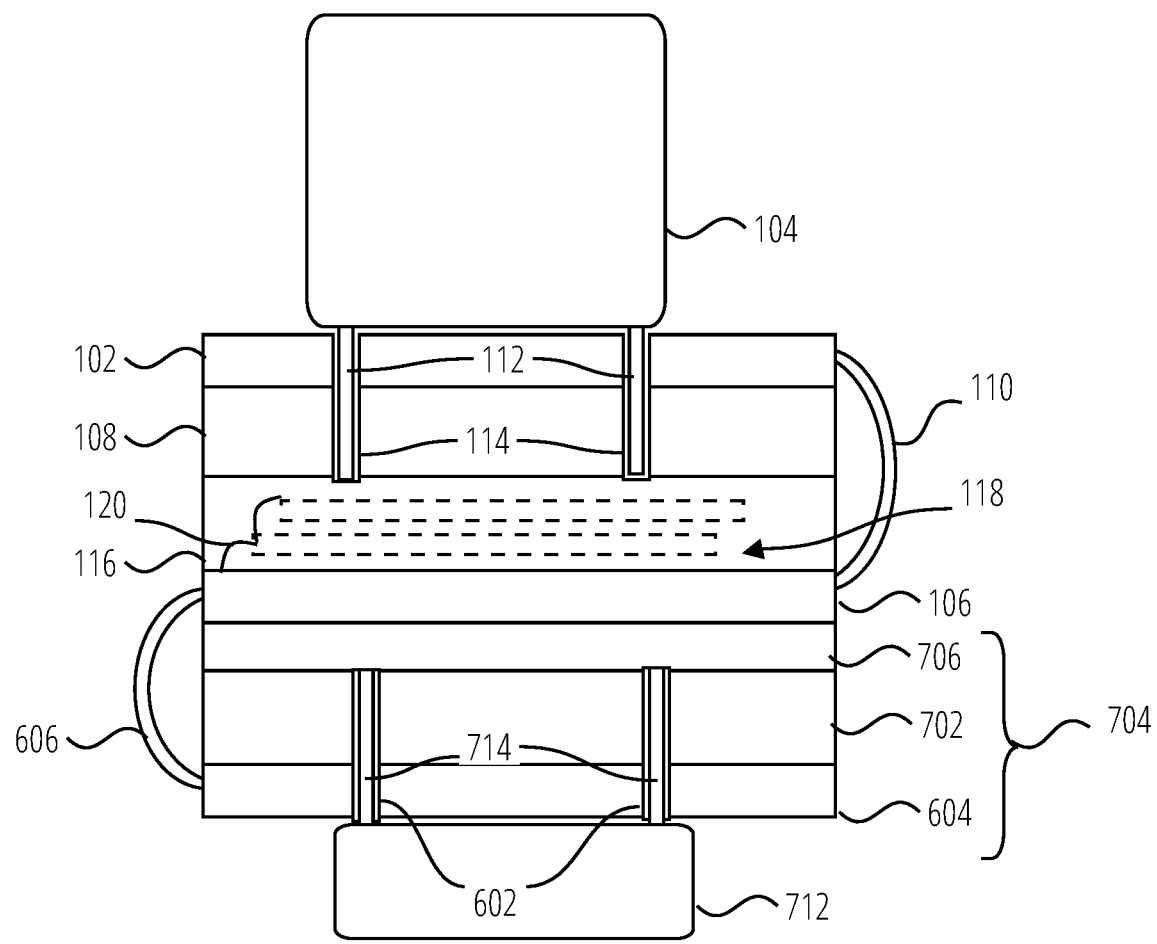
FIG. 8 illustrates another alternative apparatus in accordance with one embodiment.

The fourth mold compound layer 706 need not comprise a second semiconductor die stack 708. As shown in FIG. 8 the apparatus may be formed with only a thin fourth mold compound layer 706 that doesn't include the second semiconductor die stack 708. In such an embodiment the fourth mold compound layer 706 serves only to insulate the components of the second substrate section 106 from contact with the solder joints securing the second connector mounting pins 714. The fourth mold compound layer 706 may be eliminated entirely in the solder joints contact electrically-inactive surfaces of the second substrate section 106, or for example if recess counter tap holes are drilled in the second through-holes 602 so that the second connector mounting pins 714 need not protrude from the third mold compound layer 702 in order to be secured by soldering.

What is claimed is:

1. A method comprising:
   forming a first substrate section;
   forming a second substrate section;
   forming a flexible cable between the first substrate section and the second substrate section;
   forming a first mold compound layer on the first substrate section;
   forming a second mold compound layer on the second substrate section;
   installing mounting pins of a surface mount connector into through-holes of the first substrate section and the first mold compound layer;
   securing the mounting pins of the surface mount connector with solder joints, the mounting pins configured to structurally support the surface mount connector and not carry signals; and
   after securing the mounting pins, bending the flexible cable such that the second mold compound layer is adjacent to and coplanar with the first mold compound layer.

2. The method of claim 1 wherein the connector is a Type C USB connector.

3. The method of claim 1 further comprising bonding a semiconductor die stack to the second substrate section.

4. The method of claim 3 further comprising embedding the semiconductor die stack in the second mold compound layer.

5. The method of claim 3 further comprising forming electrical connections from the flexible cable to signal pins of the connector.

6. The method of claim 1 further comprising:
   forming a third substrate section;
   forming a second flexible cable between the second substrate section and the third substrate section;
   inserting mounting pins of a second connector into through-holes of the third substrate section; and
   bending the second flexible cable such that the third substrate section is coplanar with the second substrate section.

7. The method of claim 1, wherein the mold compound of the first mold compound layer and the second mold compound layer comprises a protective plastic material.

8. A device comprising:
   at least one surface mounted connector; and
   a plurality of fabrication layers comprising:
      a first substrate section supporting the connector;
      a first mold compound layer adjacent to and coplanar with the first substrate section;
      a second mold compound layer adjacent to and coplanar with the first mold compound layer; and
      a second substrate section adjacent to and coplanar with the second mold compound layer;
   a flexible cable joining the first substrate section to the second substrate section;
   wherein mounting holes for mounting pins of the connector extend through the first substrate section and the first mold compound layer;
   wherein solder joints are formed on the mounting pins at a terminus of the mounting pins, the mounting pins, the mounting holes, the first substrate section and the first mold compound layer configured to structurally support the surface mount connector within the device;
   wherein the mold compound of the first mold compound layer and the second mold compound layer comprises a protective plastic material; and
   wherein the second mold compound encapsulates a semiconductor die electrically bonded to the second substrate section.

9. The device of claim 8 wherein the connector is a Type C USB connector.

10. The device of claim 8 wherein the second mold compound encapsulates a semiconductor die stack electrically bonded to the second substrate section.

11. The device of claim 10 wherein the semiconductor die stack implements a secure storage device.

12. The device of claim 8 wherein the flexible cable comprises electrical connections from a semiconductor die stack to signal pins of the connector.

13. The device of claim 8 further comprising:
   a third substrate section;
   a second flexible cable comprising signal conductors between the second substrate section and the third substrate section;
   a second connector mounted on through-holes of the third substrate section; and
   the second flexible cable bent such that the third substrate section is coplanar with the second substrate section.

14. The device of claim 8, wherein the first mold compound layer has a thickness of about 0.49 mm.

15. A device, comprising:
at least one surface mounted connector; and
a plurality of fabrication layers comprising:
- a first substrate section supporting the at least one surface mounted connector;
- a first mold compound layer adjacent to and coplanar with the first substrate section;
- a second mold compound layer adjacent to and coplanar with the first mold compound layer; and
- a second substrate section adjacent to and coplanar with the second mold compound layer;

a flexible cable joining the first substrate section to the second substrate section;
wherein mounting holes for mounting pins of the connector extend through the first substrate section and the first mold compound layer;
wherein solder joints are formed on the mounting pins at a terminus of the mounting pins, the mounting pins, the mounting holes, the first substrate section, and the first mold compound layer configured to structurally support the surface mount connector within the device;
wherein the mold compound of the first mold compound layer and the second mold compound layer comprises a protective plastic material;
wherein the second mold compound encapsulates a semiconductor die electrically bonded to the second substrate section;
wherein the at least one surface mounted connector is a Type C USB connector; and
wherein the first mold compound layer has a thickness of about 0.49 mm.

* * * * *